United States Patent [19]

Schols

[11] Patent Number: 4,626,293

[45] Date of Patent: Dec. 2, 1986

[54] METHOD OF MAKING A HIGH VOLTAGE DMOS TRANSISTOR

[75] Inventor: Gustaaf Schols, Brugge, Belgium

[73] Assignee: International Standard Electric Corporation, New York, N.Y.

[21] Appl. No.: 625,723

[22] Filed: Jun. 27, 1984

[30] Foreign Application Priority Data

Jun. 27, 1983 [BE] Belgium ............... 2/60137

[51] Int. Cl.$^4$ ............... H01L 27/02; H01L 21/265
[52] U.S. Cl. ............... 148/1.5; 29/571; 29/576 B; 148/187; 148/190; 148/DIG. 82; 357/23.4; 357/91
[58] Field of Search ............... 148/1.5, 187, 190; 29/576 B, 571; 357/23.4, 91

[56] References Cited

U.S. PATENT DOCUMENTS

| | | | |
|---|---|---|---|
| 3,919,008 | 11/1975 | Iwamatsu | 148/187 |
| 3,996,655 | 12/1976 | Cunningham et al. | 29/571 |
| 4,038,107 | 7/1977 | Marr et al. | 148/1.5 |
| 4,179,312 | 12/1979 | Keller et al. | 148/1.5 |
| 4,199,774 | 4/1980 | Plummer | 357/41 |
| 4,342,149 | 8/1982 | Jacobs et al. | 29/576 B |
| 4,344,081 | 8/1982 | Pao et al. | 29/576 B |
| 4,382,826 | 5/1983 | Pfleiderer et al. | 148/1.5 |
| 4,466,175 | 8/1984 | Coe | 29/571 |
| 4,895,390 | 7/1975 | Meiling et al. | 357/23 |

OTHER PUBLICATIONS

Plummer et al. IEEE—Solid St. Circuits, SC-11 (1976) p. 809.
Mattheus in IEEE—Intl. Solid St. Circuit Conf., 1981, pp. 238-239.

Primary Examiner—Upendra Roy
Attorney, Agent, or Firm—Donald J. Lenkszus

[57] ABSTRACT

A process for manufacturing a high voltage DMOS (Deep Diffusion Metal Oxide Semiconductor) transistor includes a first ion implantation and drive-in step to form a P-well in a N-substrate, and a second such step to form a N+ region in this well and a channel between this region and the substrate and under a polysilicon gate which is covered with a silicon nitride layer during the first step. By the presence of the latter layer pitting of the gate is prevented and no leakage paths are formed between source and drain.

7 Claims, 13 Drawing Figures 4,626,293

METHOD OF MAKING A HIGH VOLTAGE DMOS TRANSISTOR

BACKGROUND OF THE INVENTION

The present invention relates to a process for making a semiconductor device, including at least a first predeposition and diffusion drive-in step of impurity material of one conductivity type in a substrate of another conductivity type so as to form a well of said one conductivity type therein, and a second predeposition and diffusion drive-in step of impurity material so as to form a region separated from the well boundary by a channel zone.

Such a process is already known from the article "A Monolithic 200-V CMOS Analog Switch" by J. D. Plummer and J. D. Meindl, published in the IEEE Journal of Solid-State Circuits, Vol. SC-11, No. 6, December 1976, pp. 809–817. It is used for making a high-voltage N-channel DMOS transistor by forming the well and the region through a same opening in an oxide layer covering the substrate. The well, the region and the substrate are made of $P^-$, $N^+$, and $N^-$ material respectively. As mentioned in this article the channel between the $N^+$ region and the $N^-$ substrate which are used as the source and the drain of the DMOS transistor should at least have a length of 2.5 micron in order to prevent punchthrough breakdown between drain and source.

It has been found that such a punchthrough breakdown is relatively frequent.

SUMMARY OF THE INVENTION

An object of the present invention is therefore to provide a process of the above type but wherein the danger of creating such leakage paths is at least considerably decreased.

According to the invention this object is achieved due to the fact that the channel zone is formed under a polysilicon gate which at least during the drive-in step is covered by a silicon nitride layer.

The silicon nitride layer having a very dense structure protects the polysilicon gate against possible undesirable effects of the first drive-in step which is carried out at a relatively high temperature, e.g. 1200° C., for a long duration, e.g. 50 hours, and in a non-oxidizing atmosphere such as nitrogen. It has been found that by proceeding in this way no pitting of the polysilicon gate occurs during the first diffusion drive-in step. As a consequence the impurity material brought in during the second predeposition step cannot reach the zone under the polysilicon gate and can therefore not affect the length of the channel thus produced.

The invention also relates to a semiconductor device made in accordance with the above process.

BRIEF DESCRIPTION OF THE DRAWING

The above mentioned and other objects and features of the invention will become more apparent and the invention itself will be best understood by referring to the following description of an embodiment taken in conjunction with the accompanying drawings in which.

DETAILED DESCRIPTION OF THE DRAWINGS

Figure 1:
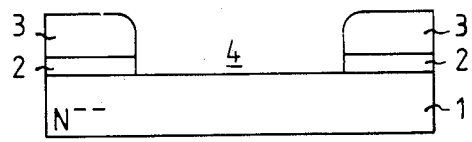
FIGS. 1 to 8 show eight successive main steps of a process for making a DMOS transistor, i.e. double diffused MOS transistor.

In FIG. 1, one starts with a $N^{--}$ substrate 1, i.e. a very lightly doped N substrate, and grows thereon a so-called field silicon oxide layer 2. A mask 3 is then formed on the so-called active region of the layer 2 to protect this region in the course of a subsequent etching operation by means of which the unprotected portions of the layer 2 are removed. Windows 4 are thus created in this layer 2.

Figure 2:
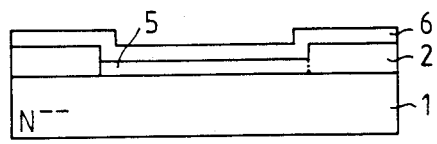

In FIG. 2, first a gate silicon oxide layer 5 is grown on the upper surface of the device and then a layer 6 of polysilicon material is deposed on the layer 5.

Figure 3:
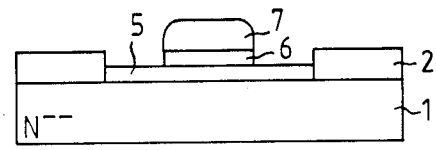

In FIG. 3, a mask 7 is formed on a so-called gate portion of the layer 6 to protect this gate portion during a subsequent etching operation by means of which the unprotected other portions of the layer 6 are removed.

Figure 4:
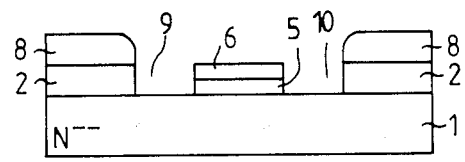

In FIG. 4, a photoresist mask 8 is again formed on the active region of the layer 2 to protect this region in the course of a subsequent etching operation by means of which the portions of the layer 5 which are not protected by the polysilicon layer 6 are removed. In this way a portion of gate oxide 5 covered by a polysilicon layer 6 and separating two windows 9 and 10 in the field oxide layer 2 is formed.

Figure 5:
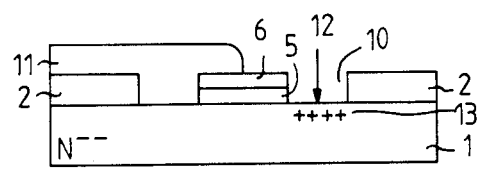

In FIG. 5 a so-called $P^-$ mask 11 is formed on the left-hand layer 2, on the substrate 1 in the window 9 and on part of the layer 6 mainly to protect this substrate 1 during a subsequent predeposition of P material, e.g. boron, in the substrate 1 through the window 10. The predeposition operation is done by aion implantation schematically indicated by the arrow 12 and produces a thin layer 13 of P material under the upper surface of the substrate 1 in the window 10. This layer 13 which is indicated by positive signs because it is produced by positive P ions is lightly doped. To be noted that during this implantation operation also the layer 6 and the unprotected layer 2 are used as a mask to ensure that P material is only implanted in the substrate surface in the window 10 and in the whole surface of this window. This is the reason why the mask 11 should not extend in the lateral direction beyond the layer 6.

Figure 6:
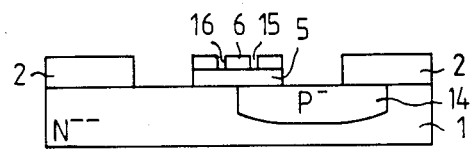

In FIG. 6, the layer 13 is driven in the surface 1 by a diffsuion drive-in operation which is carried out at a relatively high temperature, e.g. 1200° C., and for a long duration, e.g. 50 hours, in a non-oxidizing atmosphere, e.g. nitrogen. As a result a slightly doped so-called $P^-$ well 14 which extends laterally under the gate oxide layer 5 and under the field oxide layer 2 is obtained.

It has been found that after the end of the diffusion drive-in operation there may have been formed in the layer 6 pits such as 15 and 16 which extend through this layer and reach the underlying gate oxide material 5.

Figure 7:
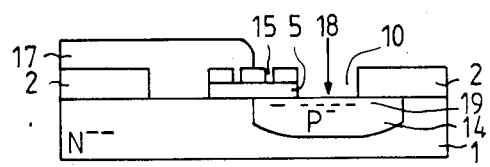

In FIG. 7, a so-called $N^+$ mask 17 is formed on the left-hand layer 2, the substrate 1 in the window 9 and part of the layer 6, mainly to protect this substrate 1 during a subsequent predeposition of N material, e.g. phosphorus, in the substrate 1 through window 10. This predeposition operation is done by ion implantation schematically indicated by the arrow 18 and produces a thin layer 19 under the upper surface of the substrate 1. However, due to the presence of the pit and because the layer 6 does not constitute a bar for the negative N ions, this layer 19 not only extends below the upper surface of the substrate 1 in the window 10, but also under the gate oxide layer 5. This layer 19 which is indicated by negative signs because it is produced by negative N ions is heavily doped.

It should be noted that during this implantation operation also the layer 6 and the unprotected layer 2 are used as a mask to ensure that except for the pits, N material is only implanted in the substrate surface in the window 10. Thus the polysilicon material 6 ensures that the layers 13 and 19 are implanted in a so-called self-aligned way, meaning that these layers are formed in accurately the same window 10.

Figure 8:
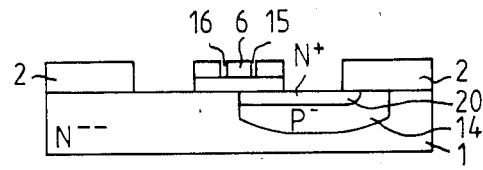

In FIG. 8, the layer 19 is driven in the P− well 14 by a diffusion drive-in operation similar to the one described above. As a result a so-called N+ region 20 is obtained which extends laterally under the field oxide layer 2 and under the gate oxide layer 5 where it reaches the boundary of the P− well 14, thus reducing the length of the channel zone between the boundaries of the region 20 and the well 14 to zero. As this region 20 and the substrate 1 are to be used as the source and the drain of a DMOS transistor respectively, the latter will obviously be inoperative.

Figure 9:
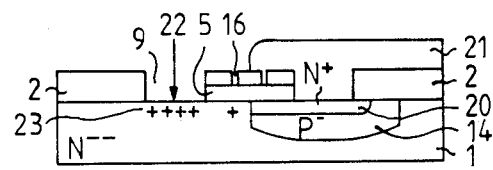
FIGS. 9 and 10 show two additional steps in the process where a PMOS transistor is fabricated.
Figure 10:
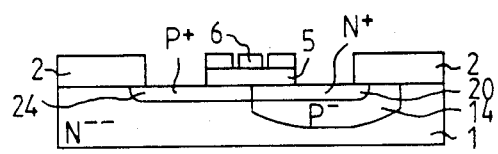

If one would also lke to realize a PMOS transistor, one could proceed as shown in FIGS. 9 and 10 and in the way briefly described hereinafter.

During a first additional main process step one forms a P+ mask 21 (FIG. 9) on the device to mainly protect the window 10 after which one implants P material in the window 9 as indicated by the arrow 22. Thus a thin layer 23 of P material and indicated by positive signs is produced under the surface of the substrate 1. However, due to the presence of the pit 16, this layer 23 not only extends below the upper surface of the substrate 1 in the window 9, but also under the gate oxide layer 5.

During a second additional main process step (FIG. 10) the layer 23 is driven in the substrate 1 and has a result a P+ region 24 obtained which extends laterally under the field oxide layer 2 and under the gate oxide layer 5 where it reaches the boundary of the P− well 14, thus reducing the length of the channel zone between the boundaries of the region 24 and the well 14 to zero. As this region 24 and the well 14 are to used as the source and the drain of a PMOS transistor, the latter will obviously be inoperative.

Figure 11:
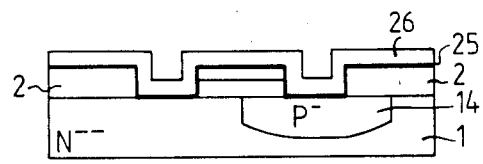
FIGS. 11 to 13 show successive steps of a process for making a semiconductor device according to the invention, the constituent parts this device being again not drawn to scale.
Figure 12:
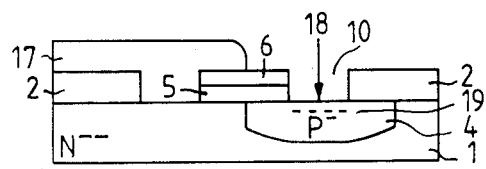
Figure 13:
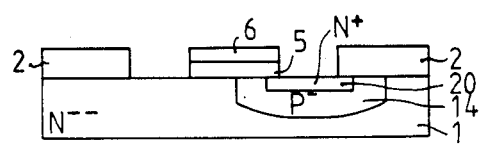

To prevent the creation of the above leakage path between for instance the N+ region 20 and the N− − substrate 1, at the start of the P− diffusion drive-in step represented in FIG. 6, first a silicon oxide layer 25 is grown on the upper surface of the device and then a silicon nitride layer 26 is deposited on the layer 25, as shown in FIG. 11. It has been found that in this way the polysilicon layer 6 is protected against the undesirable influences of the drive-in diffusion operation so that no pitting of this layer 6 is produced. As a consequence, after the end of the seventh step now shown in FIG. 12, the layer 19 does not extend beyond the window 10 so that during the subsequent diffusion drive-in operation represented in FIG. 13 no leakage path is formed between the N+ region 20 and the N− − substrate and therefore also not between the source and drain electrodes of a DMOS transistor using this region and this substrate as source and drain respectively.

The above method has been successfully implemented particularly for the production of controlled high voltage bidirectional switches able to block 300 V in either direction and of the general type disclosed in the article "400 V Switches for Subscriber Line Interface" by W. H. A. Mattheus, published in 1981, IEEE International Solid-State Circuits Conference. Digest of Papers, N.Y. U.S.A. 18–20 February 1981, pp. 238–239.

While the principles of the invention have been described above in connection with specific apparatus, it is to be clearly understood that this description is made only by way of example and not as a limitation on the scope of the invention.

What is claimed is:

1. A process for making a semiconductor device comprising the steps of:
   providing a substrate of a first conductivity type;
   covering said substrate with an oxide layer;
   forming a polysilicon gate on said oxide layer;
   forming an opening in said oxide layer;
   subjecting said substrate to a first predeposition of impurity material of a second conductivity type through said opening;
   subjecting said substrate to a first diffusion drive-in operation to form a well of said second conductivity type therein through said opening;
   subjecting said substrate to a second predeposition and second diffusion drive-in steps of impurity material to form a region in said well through said opening separated from the boundary of said well by a channel zone, said channel zone being formed under said polysilicon gate;
   covering said polysilicon gate by a silicon nitride layer during at least said first drive-in step; and
   wherein said region forms the source of said device and said substrate forms the drain of said device.

2. A process in accordance with claim 1 wherein;
   said first drive-in step is carried out in a nitrogen atmosphere.

3. A process in accordance with claim 1 wherein said first predeposition step is carried out by ion implantation.

4. A process in accordance with claim 1 wherein:
   said first diffusion drive-in is performed at a high temperature of about 1200° C. for a long duration of about 50 hours.

5. A process in accordance with claim 1 wherein:
   said first conductivity type is N type conductivity; and
   said second conductivity type is P type conductivity.

6. A process in accordance with claim 4 where said second conductivity type and said impurity material are of P type conductivity.

7. A process for making a semiconductor device comprising the steps of:
   providing a substrate of a first conductivity type;
   covering said substrate with an oxide layer;
   forming a polysilicon gate on said oxide layer;
   forming a first and a second opening in said oxide layer;
   subjecting said substrate to a first predeposition of impurity material of a second conductivity type through said first opening;
   subjecting said substrate to a first diffusion drive-in operation to form a well of said second conductivity type therein through said first opening;
   subjecting said substrate to a second predeposition and second diffusion drive-in steps of impurity material through said second opening to form a region separated from the boundary of said well by a channel zone, said channel zone being formed under said polysilicon gate;
   covering said polysilicon gate by a silicon nitride layer during at least said first drive-in step; and
   wherein said region forms the source of said device and said well forms the drain of said device.

* * * * *